(12) United States Patent
Wild et al.

(10) Patent No.: US 6,645,343 B1
(45) Date of Patent: Nov. 11, 2003

(54) PLASMA REACTOR

(75) Inventors: Christof Wild, Denzlingen (DE); Peter Koidl, Denzlingen (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/600,960
(22) PCT Filed: Jan. 20, 1999
(86) PCT No.: PCT/EP99/00349
§ 371 (c)(1), (2), (4) Date: Jul. 25, 2000
(87) PCT Pub. No.: WO99/38189
PCT Pub. Date: Jul. 29, 1999

(30) Foreign Application Priority Data

Jan. 27, 1998 (DE) .......................................... 198 02 971

(51) Int. Cl.⁷ ............................. C23C 16/00; C23F 1/00
(52) U.S. Cl. ......................... 156/345.41; 118/723 MW
(58) Field of Search ................. 118/723 MW, 118/723 ME, 723 MA, 723 MR; 156/345, 345.41, 345.42, 345.36

(56) References Cited

U.S. PATENT DOCUMENTS

| | | | |
|---|---|---|---|
| 4,866,346 A | | 9/1989 | Gaudreau et al. |
| 4,940,015 A | | 7/1990 | Kobashi et al. |
| 5,501,740 A | | 3/1996 | Besen et al. |
| 5,517,085 A | * | 5/1996 | Engemann et al. ... 118/723 AN |
| 5,628,883 A | * | 5/1997 | Sugiyama et al. ..... 204/192.32 |
| 5,803,975 A | | 9/1998 | Suzuki |
| 6,209,482 B1 | * | 4/2001 | Doehler .............. 118/723 MW |

FOREIGN PATENT DOCUMENTS

| | | |
|---|---|---|
| DE | 4217900 A1 | 12/1993 |
| DE | 4235914 A1 | 4/1994 |
| DE | 19507077 C1 | 4/1996 |
| DE | 19600223 A1 | 7/1997 |
| EP | 0564082 | 2/1993 |
| EP | 0593931 | 9/1993 |
| EP | 0772222 | 10/1996 |
| EP | 0778608 | 12/1996 |

OTHER PUBLICATIONS

International Search Report for PCT/EP99/00349 and translation thereof.
Examination Report for German Priority Application 198 02 971.3 dated Feb. 4, 1999 and translation thereof.

* cited by examiner

Primary Examiner—Luz L. Alejandro
(74) Attorney, Agent, or Firm—Volpe and Koenig, P.C.

(57) ABSTRACT

A plasma reactor (1) especially for diamond-CVD (chemical vapor deposition) or, for example, plasma surface treatment or plasma etching is provided. The plasma reactor (1) includes a reactor housing (2) designed as resonator, to which is attached a high-frequency coaxial line (5) connected with a high-frequency generator (6) for irradiation of microwaves. Located in the reactor housing is a substrate holder (3) for a substrate to be coated. A vacuum-tight window (12) of microwave-permeable material is positioned in a transition area from the coaxial line (5) to the reactor housing (2) and the reactor housing includes connections (10, 11) for supplying and removing process gas. The microwave window (12) is essentially ring-shaped. As a result, the coupling is distributed over a large surface so that high microwave power levels can be coupled without high electric field intensities developing at the microwave window and thus without the danger of window discharge.

10 Claims, 2 Drawing Sheets

PLASMA REACTOR

BACKGROUND

The present invention relates to a plasma reactor with a reactor housing designed as resonator to which is attached a high-frequency coaxial line connected with a high-frequency generator for irradiation of microwaves and in which is located a holder for a substrate to be coated, a vacuum-tight window of microwave-permeable material being positioned in the area of transition from the high-frequency coaxial line to the reactor housing and the reactor housing exhibiting connections for supplying and removing a process gas.

A similar plasma reactor is already known from U.S. Pat. No. 5,501,740. In this unit, microwave energy is supplied via a coaxial line underneath a microwave electrode also serving as a substrate holder, the inner conductor of the coaxial line being connected to the bottom side of the substrate holder. The plate-shaped electrode is connected with the reactor housing by a dielectric ring forming the microwave window.

Sealing of the reactor housing toward the outside or to the coaxial line also occurs via the microwave window. Compared to the external atmospheric pressure, reduced interior pressure prevails in the reactor housing so that relatively high forces act on the substrate holder which tensionally stress the inner conductor of the coaxial line connected with the substrate holder. Accordingly, stable attachment and external anchoring of the inner conductor and correspondingly complicated mechanical securing measures are required.

Further disadvantageous is the fact that in this design, the substrate holder is only very poorly accessible so that it is difficult and complicated to realize techniques such as, for example, substrate cooling, substrate rotation or positioning, temperature control, etc. In particular, supply lines need to be led here in disadvantageous fashion through the inner conductor of the coaxial line. However, only very limited room is available here.

Known from U.S. Pat. No. 4,866,346 as well as DE 195 07 077 are plasma reactors in which the substrate holder has relatively good accessibility.

In the case of U.S. Pat. No. 4,866,346, however, there is the disadvantage that the position and form of the plasma depend very sensitively on process parameters such as gas pressure and coupled microwave power. In addition, these two process parameters are not selectable independently of each other, but rather are adjustable in mutual dependence only within a relatively narrow correlation range. Upon leaving this correlation range, a sudden spatial shift of the plasma often occurs, which, in addition to disturbing the deposition process, quickly destroys, for example, a quartz glass limiting the reaction volume. A further disadvantage is the strong dependence of the position of the plasma on the geometric limit conditions and the arrangement of the reaction unit.

With DE 195 07 077, very good plasma form and stability can be attained, to be sure; however, a deposition chamber positioned within the reactor housing and surrounded by a quartz bell is provided here, in which the substrate holder is located. This leads to unfavorable size ratios since the resonator is clearly larger than the actual deposition chamber.

Known from EP 778 608 A2 is a plasma generator and a process for producing a plasma whereby through several waveguides microwave energy is carried to a ring-shaped distribution channel. The irradiation in the reactor chamber follows through several, around the perimeter arranged microwave windows. On the path of the distribution channel a damping exists created through enclosure position differences in coupling performance, which stimulates a non-rotationally symmetric mode, from which an non-symmetrical and non-uniform plasma results, so that in the coating of a substrate in plasma, no homogenous coating is obtainable.

SUMMARY

It is the object of the present invention to provide a plasma reactor of the type mentioned above in which the substrate is accessible in good and simple fashion, among other things, for cooling measures, for positioning, temperature control, and similar measures. In addition, the produced plasma should be stable with regard to plasma position, intensive, spatially extended, and homogeneous. Finally, the plasma reactor should exhibit an overall compact design.

In solving this problem, it is proposed that the high-frequency coaxial line, at its delivery end outside the reactor housing, is funnel-shaped and essentially rotationally symmetric and directed at the periphery of the reactor housing toward the essentially ring-shaped, microwave window for a coupling that is distributed over the entire ring surface of the microwave window.

As a result of the microwave irradiation occurring outside at the periphery of the reactor housing, practically the entire interior volume of the reactor housing is available as interior space for the actual deposition chamber. Accordingly, particularly favorable size relationships result for the reactor, with the advantage of a compact design. In addition, practically the entire outer wall of the reactor housing and thus the deposition chamber can be easily cooled since it is highly accessible. Thus, in particularly simple fashion, the possibility exists for the reactor walls to consist extensively of double-wall, metallic, water-cooled walls.

The ring-shaped wave-guide section in connection with the microwave window positioned peripherally on the reactor housing also has the advantage that the coupling field in the peripheral direction overalll has the same phase, which results in a rotationally symmetrical field and plasma distribution. Also, the coupling is distributed over a large surface. As a result, high microwave power levels can be coupled without high electric field intensities developing at the microwave window and thus without the danger of window discharge. This is an important condition especially for the stability of the plasma position.

Especially advantageous here, too, is the fact that the operating ranges of microwave irradiation, on the one hand, and substrate holder with associated elements, on the other, form separate operating ranges which can thus be designed and dimensioned corresponding to current requirements. In particular, design optimizations can be independently undertaken as a result.

The separate operating ranges also give good accessibility of the substrate holder and thus especially simply designed supply lines (for example, for coolants) and means for positioning (e.g., substrate rotation) as well as for temperature control and the like.

An advantageous embodiment of the present invention provides that the reactor housing is subdivided into two sections electrically insulated from each other, at least one of these sections being combined with a substrate holder while the other section electrically insulated therefrom serves preferably as the electrode for d.c.-voltage or high-frequency discharge.

The peripherally extending, ring-shape constructed microwave window is formed advantageously of an electrically insulating, microwave permeable material, preferably quartz, and is inserted between the two housing sections as an insulator.

In this case, the microwave window, itself, forms the insulator between the housing sections so that an additional insulator can be foregone and construction is simplified. The use of quartz for the microwave window has the advantage that such a window also withstands very high temperature gradients.

If necessary, the connection for supplying or removing a process gas can face the substrate holder and can preferably be directed approximately centrally toward the substrate holder. This central gas supply favors homogenous coating as well as high rotational symmetry in the deposition process.

A modified embodiment of the present invention provides that a substrate holder is preferably combined with each of the two housing sections and that these substrate holders are positioned particularly directly opposite to each other and preferably both in a common area of high field strength.

As a result, simultaneous coating of two substrates and thus energy-saving economic processing are possible.

If necessary, the resonator formed by the reactor housing can also be designed such that there exist spatially separated areas of high or maximum field strength in which the substrate holders are positioned.

Additional embodiments of the invention are presented in the further subclaims.

BRIEF DESCRIPTION OF THE DRAWINGS

The present invention with its essential details is described more closely below on the basis of the drawings. These include.

DETAILED DESCRIPTION OF THE PREFERRED EMBODIMENT

Figure 1:
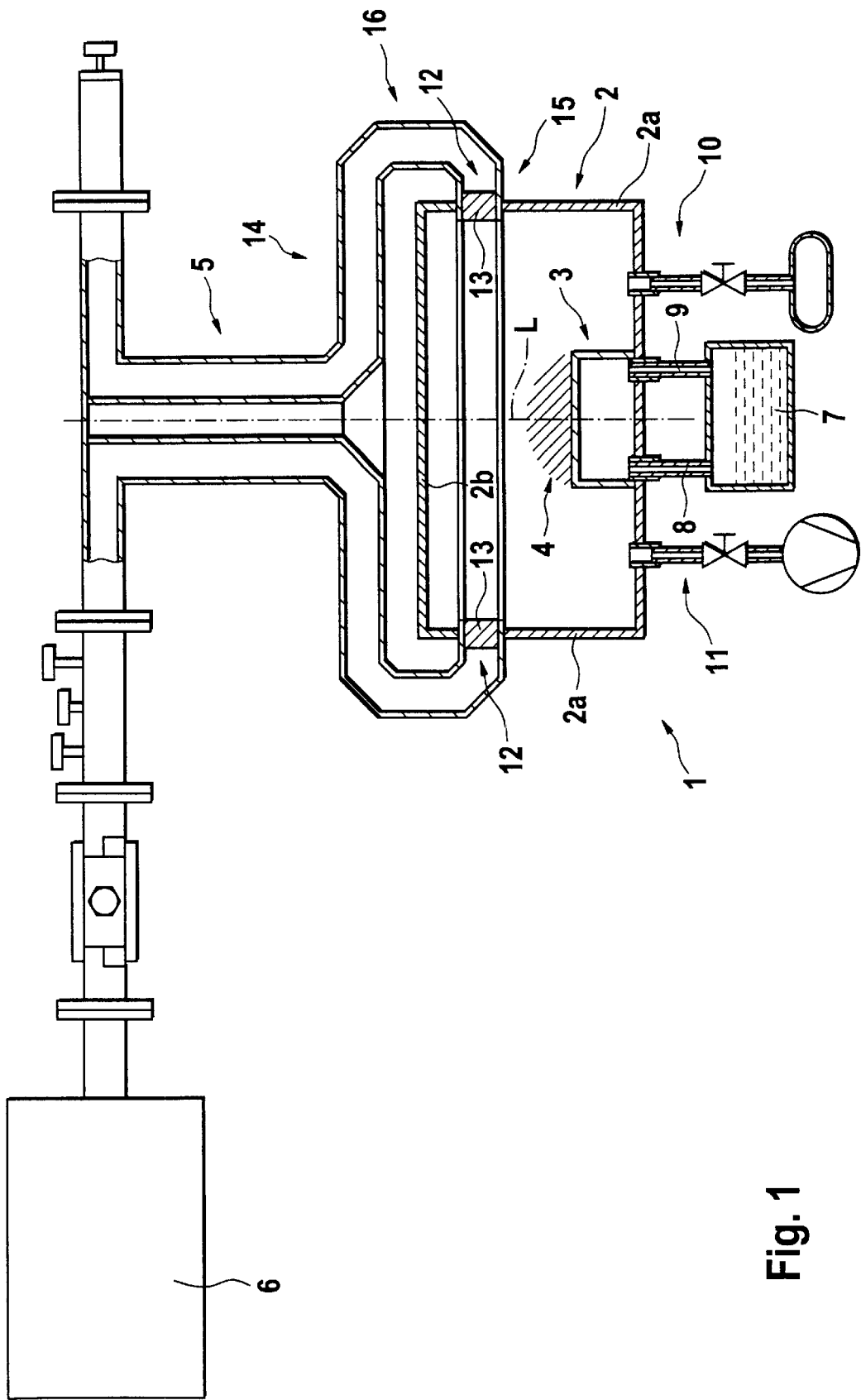
FIG. 1 is a lateral view of a plasma reactor with a substrate holder positioned in its housing.

The plasma reactor 1 represented schematically in FIG. 1 exhibits a reactor housing 2 designed as resonator, in which a substrate holder 3 is located. A substrate can be positioned on this substrate holder 3 and can then be coated with the aid of a plasma 4.

The plasma reactor 1 is preferably suited for diamond-CVD (chemical vapor deposition) and other applications such as, e.g., plasma deposition of other materials, plasma surface treatment, and plasma etching. As already mentioned above, the plasma reactor is preferably suited for diamond-CVD because it permits plasma deposition of large-area diamond disks through production of microwave plasmas at relatively high gas pressures and high efficiencies.

Attached to the reactor housing 2 is a high-frequency coaxial line 5 for irradiation of microwaves into the reactor housing 2, the line being connected at its other end with a microwave generator 6.

Further attached to the reactor housing is a cooling device 7 with a coolant inlet 8 as well as a coolant outlet 9 via which the substrate holder can be cooled. Finally also recognizable in FIG. 1 are a gas inlet 10 and a gas outlet 11 designed for conducting gas into the interior of the reactor housing 2. If, for example, a carbon-containing reaction gas is used, diamond can be deposited on a substrate.

Through irradiation with microwave radiation, the plasma 4 is ignited, the position of the plasma depending on the field-strength distribution of microwaves within the reactor housing. Deviating from the purely schematic representation according to FIG. 1, the reactor housing can accordingly be shaped or designed such that a zone of high or maximum field strength results in the area of the substrate and thus makes possible an optimal plasma in this area.

The coaxial line 5 is subdivided at its delivery end outside the reactor housing 2 and directed at the periphery of the reactor housing 2 toward an essentially ring-shaped microwave window 12. In practice, this window 12 is formed by a quartz ring 13, which is tightly joined with the bordering housing sections. As can be clearly recognized in FIG. 1, the reactor housing 2 is designed to be rotationally symmetric with respect to a longitudinal axis L indicated as a dash-dot line.

The reactor housing 2 can be rectangular, polygonal, round, or curved in a sectional plane containing longitudinal axis L. For example, the possibility also exists for shaping the housing as an ellipsoid.

The microwave window 12 lies in a plane which is spaced from the bearing surface or attachment side of the substrate holder 3, in the embodiment described, the top side. The precise position relative to each other can be varied according to practical requirements.

The quartz ring 13 forming the microwave window 12 is particularly shaped circularly throughout in the peripheral direction so that the reactor housing 2 is subdivided into two housing sections 2a and 2b electrically insulated from each other. As a result, among other things, the possibility exists for using the upper section 2b as the electrode for an additional d.c.-or high-frequency voltage. It can also be clearly recognized in FIG. 1 that the irradiation range for the microwaves and the substrate-holder area with associated connections for process gas, coolant, temperature measurement, substrate rotation, and the like are spatially separated from each other. The individual areas and equipment provided there are thus not in the way of each other. Through the separation of the individual areas, substantially better accessibility is obtained, especially as regards the substrate holder.

The high-frequency coaxial line 5 subdivided on its delivery end outside the reactor housing 2 is expanded essentially in a funnel shape and linked up from the outside to the microwave window 12. For this purpose, the coaxial line is attached centrally in the area of transition to the reactor housing to a flat, plate-shaped waveguide section 14 connecting to which on the outside is a ring-shaped deflecting waveguide section 16 with its exit end 15 facing the outside of the microwave window 12. The coupling of the microwaves in the reactor chamber is thus distributed in rotationally symmetrical fashion over the entire ring surface of the microwave window 12.

Figure 2:
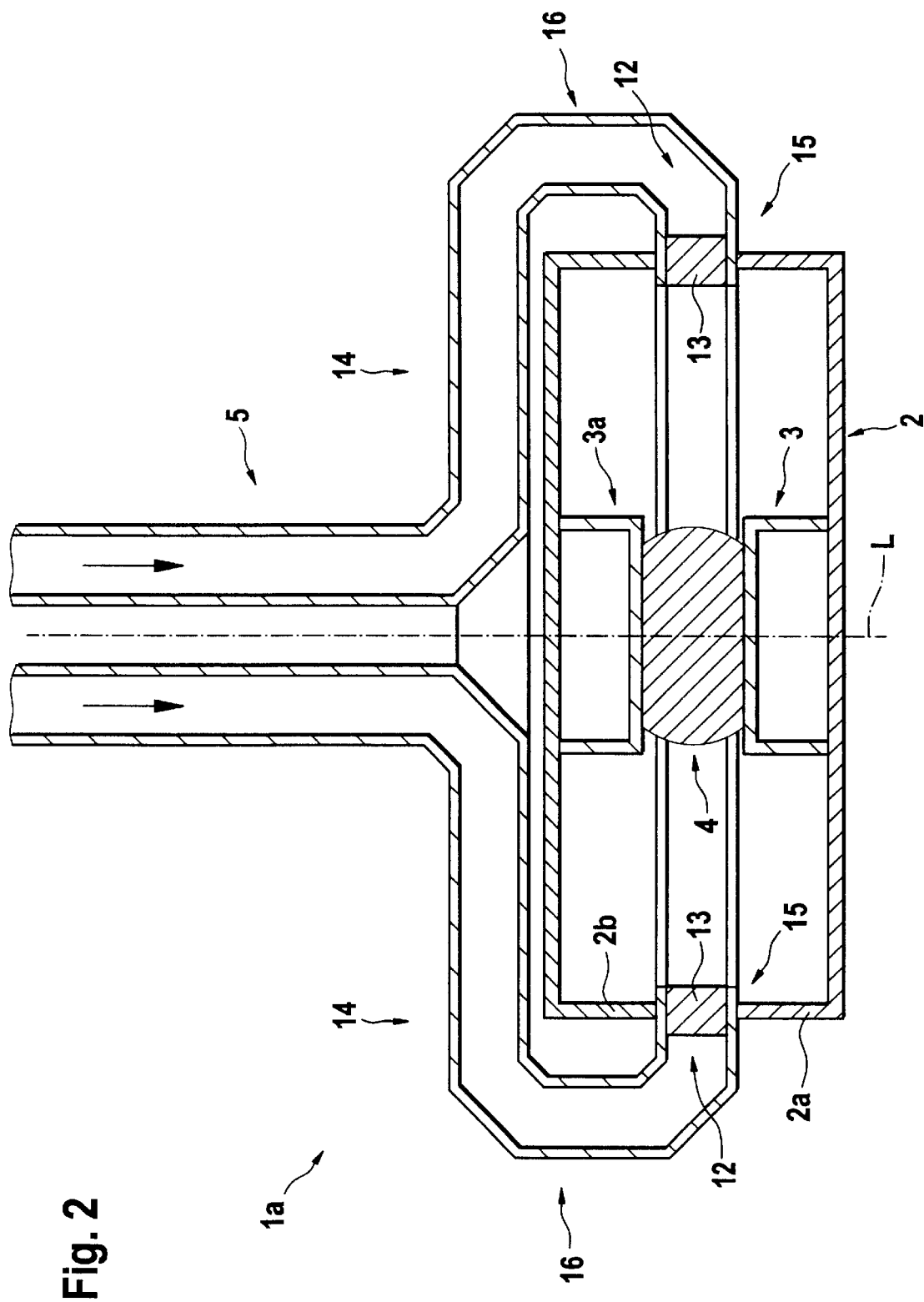
FIG. 2 is a partial view of a plasma reactor corresponding essentially to FIG. 1, but in this case with two opposing substrate holders located in the reactor housing.

FIG. 2 shows a plasma reactor 1a which is constructed essentially like the plasma reactor 1 shown in FIG. 1. In contrast to the latter, two opposing substrate holders 3,3a are provided centrally within the preferably rotationally symmetric reactor housing 2. The facing sides of the two substrate holders each serve as a support for a substrate. In the present embodiment, the two substrate holders 3,3a are arranged such that the substrates positioned there are in contact with a common plasma 4 (indicated by hatching). However, there is also the possibility of selecting a reactor-housing shape in which the two substrate holders are located in areas of high field strength separated from each other so that separated plasmas are formed there, too, in each case.

In FIG. 2, one can further nicely recognize that the microwave-window plane, which runs perpendicular to the longitudinal axis L in the present embodiment, runs approximately centrally between the supporting or attaching sides of the two substrate holders 3,3a. With the possibility for simultaneously coating two substrates in one reactor housing, one can operate particularly economically.

What is claimed is:

1. A plasma reactor comprising:
    a reactor housing (2) designed as a resonator in which a substrate holder (3) for a substrate to be coated is located, the reactor housing (2) including connections (10, 11) for supplying and removing a process gas, and having a ring-shaped, vacuum-tight window (12) of microwave-permeable material with a ring surface that extends about a circumference of the reactor housing;
    a high-frequency coaxial line (5) arranged coaxially with a longitudinal axis of the housing and being connected with a high-frequency generator (6) for irradiation of microwaves and having a delivery end at a transition area from the high-frequency coaxial line to the housing that is directed at the microwave-permeable window;
    the high-frequency coaxial line (5) is funnel-shaped as it extends through the transition area to the delivery end outside the reactor housing (2) and is essentially rotationally symmetric and is directed at a periphery of the reactor housing (2) toward the microwave window (12) for a coupling that is symmetrically distributed over the entire ring surface of the microwave window.

2. The plasma reactor according to claim 1, wherein the reactor housing (2) is subdivided into two sections (2a,2b) electrically insulated from each other, at least one of the sections (2a) is combined with the substrate holder (3), and the other section (2b) is electrically insulated therefrom and serves as an electrode for d.c.-voltage or high-frequency discharge.

3. The plasma reactor according to claim 2, wherein the microwave window (12) lies in a plane which located spaced from a supporting side of the substrate holder (3).

4. The plasma reactor according to claim 1, wherein the microwave window (12) is formed of an electrically insulating microwave-permeable quartz that acts as an insulator between two housing sections (2a,2b) that form the housing.

5. The plasma reactor according to claim 1, wherein a housing section (2a) joined with the substrate holder (3) includes connections for supplying and removing the process gas and a substrate cooling device (7).

6. The plasma reactor according to claim 1, wherein at least one of the connections (10) for supplying or removing the process gas faces the substrate holder (3) and is directed approximately centrally toward the substrate holder (3).

7. The plasma reactor according to claim 1, wherein the reactor housing (2) is rotationally symmetrical with respect to a longitudinal axis (L), the reactor housing (2) includes two sections (2a,2b) that exhibit a junction plane extending at a right angle to the longitudinal axis (L), and the ring-shaped microwave window (12) is positioned in this junction plane.

8. The plasma reactor according to claim 7, wherein a substrate holder (3,3a) is combined with each of the two housing sections (2a,2b) and the substrate holders (3,3a) are positioned directly opposite to each other and in a common area of high field strength.

9. The plasma reactor according to claim 8, wherein the microwave window (12) lies in a plane which is located centrally between supporting sides of the substrate holders.

10. The plasma reactor according to claim 1, wherein the high-frequency coaxial line (5) is subdivided along the delivery end outside the reactor housing (2) and is attached centrally in a transition area to the reactor housing (2) to a flat, plate-shaped waveguide section (14) that is connected to a ring-shaped deflecting waveguide section (16) having an exit end facing the ring surface of the microwave window (12).

* * * * *